United States Patent [19]

Tanaka et al.

[11] Patent Number: 5,049,970
[45] Date of Patent: Sep. 17, 1991

[54] HIGH RESISTIVE ELEMENT

[75] Inventors: Kenichi Tanaka; Shigeo Onishi, both of Nara; Toshiyuki Okumura, Tenri; Keizo Sakiyama, Kashihara, all of Japan

[73] Assignee: Sharp Kabushiki Kaisha, Osaka, Japan

[21] Appl. No.: 537,154

[22] Filed: Jun. 12, 1990

Related U.S. Application Data

[63] Continuation of Ser. No. 272,662, Nov. 17, 1988, abandoned.

[30] Foreign Application Priority Data

Nov. 17, 1987 [JP] Japan .................. 62-290832

[51] Int. Cl.5 ......................... H01L 27/02
[52] U.S. Cl. ........................ 357/51; 357/6; 357/23.1
[58] Field of Search ............ 357/51, 6, 63, 23.1

[56] References Cited

FOREIGN PATENT DOCUMENTS

| 52-37780 | 3/1977 | Japan | 357/51 |
| 55-26625 | 2/1980 | Japan | 357/51 |
| 55-83256 | 6/1980 | Japan | 357/51 |
| 60-120549 | 6/1985 | Japan | 357/6 |
| 62-263668 | 11/1987 | Japan | 357/51 |

Primary Examiner—Andrew J. James
Assistant Examiner—Courtnay A. Bowers
Attorney, Agent, or Firm—Irell & Manella

[57] ABSTRACT

A high resistive element is provided that constitutes an element of integrated circuits comprising an oxide film formed on a semiconductor substrate and a polysilicon film formed on the oxide film. The high resistive element is prepared by ion injection of silicon ions and conductive impurities in the oxide film through the polysilicon film.

4 Claims, 2 Drawing Sheets

HIGH RESISTIVE ELEMENT

This application is a continuation of application Ser. No. 07/272,662, filed 17 Nov. 1988 now abandoned.

BACKGROUND OF THE INVENTION

1. Field of the Invention

This invention relates to a high resistive element constituting an element of integrated circuits and more particularly to a high resistive element constituting a memory cell of static RAMs by being connected to MOS transistors.

2. Description of the Prior Art

As semiconductor integrated-circuit devices have been used in a wide variety of instruments, circuit elements with high reliability that can be readily formed on a semiconductor substrate are required as each element constituting the integrated circuit.

As a means of holding information electrically, there is a static RAM that is composed of MOS transistors capable of reading out and writing information, and this kind of memory devices usually contain load elements with a high resistance in their memory cells.

FIG. 3 shows an electric circuit of a conventional static RAM in which the load element is composed of resistive elements, and FIG. 4 is a fragmentary sectional view of the static RAM shown in FIG. 3. In FIG. 3, reference symbols T1 to T4 are MOS transistors; reference symbols R1 to R4 are load resistors connected in series with the MOS transistors T1 and T2, respectively. The driver transistors T1 and T2 constitutes a flip-flop circuit together with the load resistors R1 and R2. On the other hand, the MOS transistors T3 and T4 are used for reading out of and writing on the flip-flop circuit by means of address signals fed to their gates.

One end of the load resistors R1 and R2 is connected to the drain of the MOS transistors T1 and T2, respectively. The other end of these load resistors is connected to the power source Vcc.

FIG. 4 is a fragmentary sectional view showing the above-mentioned load resistor R1 or R2. In this figure, reference numeral 1 is a silicon substrate, reference numeral 2 is a field oxide film for the separation of neighboring MOS transistors, reference numerals 3 and 4 are source and drain regions of the MOS transistor, on which is formed thermal oxide film 10, reference numeral 5 is a gate made of either a first polysilicon film or a low resistive material such as a metal with a high melting point for constituting the driver transistor T1 or T2, reference numeral 6 is a wiring portion made of a second polysilicon film to which impurities are added at a high concentration, and reference numeral 7 is a load resistor that is prepared by adjusting to a slight trace level the amount of impurities added to a part of the wiring portion 6 made of the second polysilicon film. Moreover, reference numeral 8 is an interlevel insulator formed between the first and second polysilicon films and between these polysilicon films and the aluminum wiring 9.

The load resistors R1 and R2 made of a second polysilicon film that are required to function as circuit elements in a static RAM must have a high resistance of tens of megaohms to hundreds of megaohms or more to reduce the current flowing through the load resistors. Therefore, impurities to be added to the polysilicon films must be limited to a slight trace amount. Moreover, because the load resistor 7 is formed from the second polysilicon film as a continuous body together with the wiring pattern 6, there is a danger that the impurities contained in the wiring portion 6 at a high concentration may diffuse to the high resistive portion 7, which causes a change in the resistance of the load resistor 7. Therefore, to reduce such a change in resistance, the load resistor must have a length of at least 3 to 5 $\mu$m, which imposes many restrictions on the miniaturization of semiconductor integrated circuits by the shortening of load resistors.

The conventional load resistor mentioned above is produced by adding a slight trace amount of impurities to the polysilicon films. Therefore, such a load resistor has the following disadvantages; when the integrated circuit is in the operating condition, the resistance of the load resistor varies considerably by about two orders or more of magnitude due to a change in ambient temperature in the range of 0° C. to 100° C. The current flowing through the load resistor, particularly when the integrated circuit is in the stand-by condition, varies approximately in proportion to the variation in the resistance of the load resistor. There is also a restriction on the length of resistors from the viewpoint of an increase in the density of integrated circuits and miniaturization thereof. In addition, there is a secondary problem that the number of manufacturing steps is increased by use of a two-layered polysilicon film, causing a higher production cost.

SUMMARY OF THE INVENTION

The high resistive element of this invention, which overcomes the above-discussed and numerous other disadvantages and deficiencies of the prior art, constitutes an element of integrated circuits comprising an oxide film formed on a semiconductor substrate and a polysilicon film formed on the oxide film, wherein the high resistive element is prepared by ion injection of silicon ions and p-type or n-type conductive impurities in the oxide film through the polysilicon film.

In a preferred embodiment, the integrated circuit mentioned above is a static RAM and the high resistive element of this invention is connected in series with a MOS transistor formed in the semiconductor substrate under the oxide film, the MOS transistor constituting a memory cell of the static RAM.

In a preferred embodiment, the conductive impurities have a conductivity type opposite to that of said semiconductor substrate.

In a preferred embodiment, the conductive impurities mentioned above are phosphorus ions.

Thus, the invention described herein makes possible objectives of (1) providing a high resistive element with excellent characteristics in that high resistance is obtained with a small element area and in that a variation in its resistance with temperature is small, because the resistive element can be made of a high resistive oxide film instead of a high resistive polysilicon film that has been used for conventional load resistors in a static RAM; (2) providing a high resistive element to which impurities are added by ion injection, so that there is no need of considering lateral diffusion of impurities, thereby attaining miniaturization of the resistive element; (3) providing a high resistive element for which only an ion-injection process is required, so that it is possible to reduce the production cost thereof as compared with a conventional two-layered polysilicon process; and (4) providing a high resistive element that can provide static RAMs with a low production cost.

BRIEF DESCRIPTION OF THE DRAWINGS

This invention may be better understood and its numerous objects and advantages will become apparent to those skilled in the art by reference to the accompanying drawings as follows.

DETAILED DESCRIPTION OF THE PREFERRED EMBODIMENTS

The high resistive element of this invention is composed of an oxide film formed on a semiconductor substrate, to which silicon and conductive impurities are added at a high concentration by ion injection. The first ion injection of silicon at a high concentration changes the stoichiometric composition of the oxide film from $SiO_2$ to $SiO_x$ (where $x<2$), allowing a lower potential barrier at the interface between the oxide film and the substrate. The subsequent ion injection of impurities such as phosphorus at a high concentration makes conductive levels for electrons in the oxide film. Based on these effects, the inventors succeeded in the production of a high resistive element with little variation in resistance due to a change in temperature.

EXAMPLES

Figure 1:
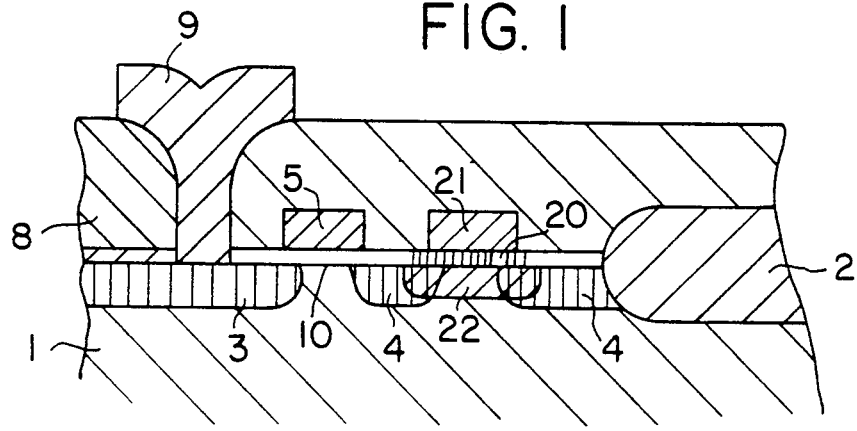
FIG. 1 is a fragmentary sectional view of the static RAM with the high resistive element of this invention.
Figure 4:
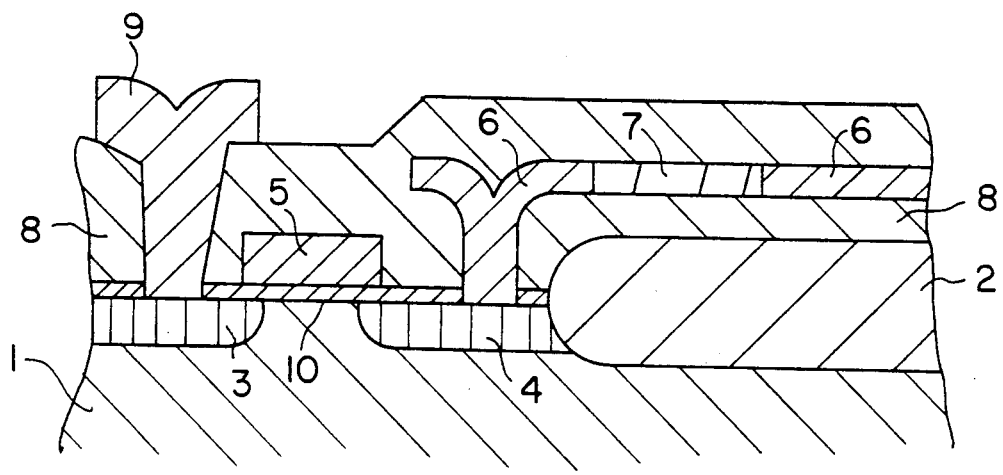
FIG. 4 is a fragmentary sectional view of the static RAM with the conventional resistive element.

FIG. 1 is a fragmentary sectional view of the static RAM with the high resistive element of this invention, and the same reference numerals therein as those of the conventional system provided in FIG. 4 represent the same parts as those given in the letter.

In FIG. 1, on the surface of a semiconductor substrate 1 in which a source region 3 and a drain region 4 are formed for constituting a MOS transistor, there is formed a thermal oxide film 10 that becomes a gate oxide film of the MOS transistor. A part of the thermal oxide film 10 on the surface of the substrate, which part is located on the drain region, constitutes a high resistive element 20 that is connected to the MOS transistor. As will hereinafter be explained, the high resistive element 20 can be produced by ion injection of large amounts of silicon and phosphorus in the thermal oxide film 10 through a polysilicon film 21. The polysilicon film 21 becomes an electrode through which an electric current flows from the power source Vcc to the high resistive element 20. On the thermal oxide film 10, a gate electrode 5 is formed by utilizing another part of the polysilicon film in addition to the above-mentioned high resistive element 20. Moreover, an interlevel insulator 8 and an aluminum wiring 9 are formed in the same way as for the conventional system, thus providing a semiconductor integrated circuit in which the high resistive element 20 is connected to the MOS transistor.

Next, the manufacturing process of an integrated circuit with high resistive elements as mentioned above will hereinafter be explained.

First of all, on a silicon substrate 1, a field oxide film 2 is formed in the same way as the manufacturing process of the conventional system, and a gate oxide film 10 with a thickness of about 200 Å to 300 Å is formed on the part of the substrate, the part defining an area in which elements of the integrated circuit are provided. At this time, also produced is a part of the oxide film, which later becomes a high resistive oxide film 20.

Then, a polysilicon film with a thickness of about 1000 Å to 2000 Å is grown on the semiconductor substrate including the gate oxide film 10. After a photoresist is applied to the polysilicon film, the photoresist on the area in which the high resistive oxide film is to be formed is removed in a required pattern, and an ion injection reaching the oxide film 10 is carried out through the exposed polysilicon film. According to this ion injection, the oxide film 10 is allowed to change into a high resistive oxide film 20. The impurities added by ion injection reach the semiconductor substrate 1 through the oxide film to form an impurity region 22. The conditions of ion injection and the like are set so that the horizontal shape and the dimensions of the impurity region 22 may be about the same as those of the high resistive oxide film 20.

When the above-mentioned ion injection is carried out, silicon is first injected at a high concentration, because the oxide film 20 is a silicon oxide film. More particularly, the injection energy is adjusted so that the projected range $R_p$ may be at the interface between the oxide film and the silicon substrate, and the amount of injected impurities is set to be $1 \times 10^{16}$ cm$^{-2}$. In the case in which the polysilicon film mentioned above on the substrate has a thickness of 1500 Å, this amount of injected impurities corresponds to a change in the composition ratio between silicon and oxygen of the oxide film from 1:2 (i.e., $SiO_2$) to 1:1.9 (i.e., $SiO_{1.9}$). Following the ion injection of silicon, the subsequent ion injection of phosphorus in the amount of approximately $1 \times 10^{16}$ cm$^{-2}$ is carried out at an injection energy that provides the same projected range $R_p$ as in the ion injection of silicon. The phosphorus added by ion injection also reaches the silicon substrate 1 to form the impurity region 22. After the photoresist covering the polysilicon film is removed, a heat treatment is conducted to recover the crystallinity of the ion-injected portion that has become amorphous and to activate the ions injected. Next, to reduce the resistance of the other portion of the polysilicon film, in which no ions have been injected, the phosphorus ions are allowed to diffuse into the polysilicon film by thermal diffusion or the like, and a gate electrode 5 and an electrode 21 for the high resistive oxide film are formed into a required shape. At this time, the latter electrode 21 for the high resistive oxide film is etched into a smaller shape than the horizontal shape of the impurity region 22. Then, in the semiconductor substrate 1 that has undergone the above-mentioned process, impurities of a conductivity type opposite to that of the substrate 1 (that is, phosphorus is used in this example) are injected by use of the gate electrode 5 and the electrode 21 for the high resistive oxide film as a mask for ion injection in the same way as in the conventional system, resulting in a source region 3 and a drain region 4.

Here, because the impurity region 22 formed in the semiconductor substrate also contains phosphorus ions injected through the oxide film 20 as impurities, the drain region 3 of the MOS transistor is connected electrically with the high resistive oxide film 20 and further connected to the power source Vcc through the electrode 21.

After etching the polysilicon film in a form of electrode, a wiring 9 is formed through the interlevel insulator 8, resulting in a static RAM with the high resistive oxide film used as a load resistor.

The high resistive element produced in the above-mentioned process allows an electric current to flow in the direction perpendicular to the substrate, and can be used as a load resistor because it has a resistance of 1 teraohm or more when an applied voltage is 5 volts per $\mu m^2$.

Figure 2:
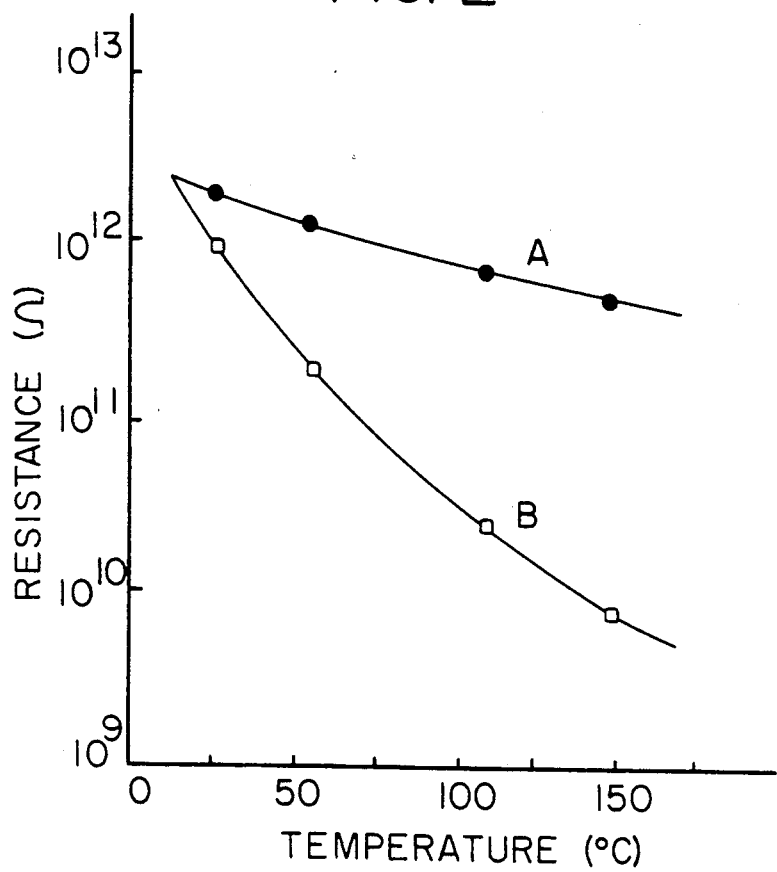
FIG. 2 shows temperature dependence of resistance with respect to the high resistive element of this invention and the conventional resistive element.
Figure 3:
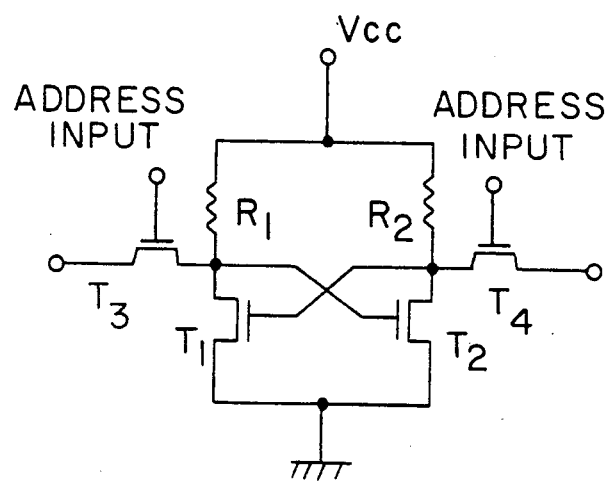
FIG. 3 is an electric circuit of the memory cell of the static RAM.

Moreover, with the high resistive element of this invention, the variation in its resistance with temperature can be controlled within an extent of about 3 times as large as the lowest value in the range of 0° to 100° C., and the variation in current with the operating temperature when the static RAM is in the stand-by condition can be kept smaller than that of the static RAM with a conventional structure. The curve A of FIG. 2 shows a temperature dependence of the resistance of the high resitive element given in the above-mentioned example, and the curve B shows a temperature dependence of the resistance of a conventional resistive element that is produced by adjusting the amount of impurities injected in the polysilicon film. As seen from this figure, the high resistive element of this invention exhibits only a very small variation in resistance as compared with the conventional resistive element.

Although the above-mentioned example discloses only a semiconductor integrated circuit in which a gate electrode is formed of a single polysilicon layer, this invention is, of course, applicable to any integrated circuits in which a two-layered polysilicon film is used as a gate electrode to miniaturize the memory cell of the integrated circuit.

Moreover, in the above-mentioned example, as impurities to be added to the oxide film, phosphorus is injected after the ion injection of silicon. However, this invention should not be limited to phosphorus, but various impurities other than phosphorus can be used in this invention depending on the conductive type of the source and drain regions of MOS transistors to be formed in the semiconductor substrate.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A high resistive element that constitutes an element of integrated circuits comprising an oxide film formed on a semiconductor substrate and a polysilicon film formed on said oxide film, said polysilicon film being positioned above an impurity region in said substrate, wherein said high resistive element is prepared in said oxide film at the same time that said impurity region is formed by ion injection of silicon ions and conductive impurities in said substrate through said polysilicon film so that the concentration of silicon and the concentration of conductive impurities are both greatest at the interface between the semiconductor substrate and the oxide film, wherein said high resistive element exhibits a resistance of 1 teraohm or more.

2. A high resistive element according to claim 1, wherein said integrated circuit is a static RAM and wherein said high resistive element is connected in series with a MOS transistor formed in said semiconductor substrate under said oxide film, said MOS transistor constituting a memory cell of said static RAM.

3. A high resistive element according to claim 1, wherein said conductive impurities have a conductivity type opposite to that of said semiconductor substrate.

4. A high resistive element according to claim 1, wherein said conductive impurities are phosphorus.

* * * * *